US012730159B2

(12) United States Patent
Raith

(10) Patent No.: US 12,730,159 B2
(45) Date of Patent: Sep. 8, 2026

(54) METHOD FOR SIMULATING A TRANSFORMER

(71) Applicant: Siemens Energy Global GmbH & Co. KG, Munich (DE)

(72) Inventor: Johannes Raith, Passail (AT)

(73) Assignee: Siemens Energy Global GmbH & Co. KG, Munich (DE)

( * ) Notice: Subject to any disclaimer, the term of this patent is extended or adjusted under 35 U.S.C. 154(b) by 180 days.

(21) Appl. No.: 18/706,902

(22) PCT Filed: Oct. 25, 2022

(86) PCT No.: PCT/EP2022/079719
§ 371 (c)(1),
(2) Date: May 2, 2024

(87) PCT Pub. No.: WO2023/083599
PCT Pub. Date: May 19, 2023

(65) Prior Publication Data
US 2026/0160831 A1 Jun. 11, 2026

(30) Foreign Application Priority Data
Nov. 10, 2021 (DE) .................... 10 2021 212 651.0

(51) Int. Cl.
*G01R 31/62* (2020.01)

(52) U.S. Cl.
CPC .................................. *G01R 31/62* (2020.01)

(58) Field of Classification Search
CPC .................................................... G01R 31/62
See application file for complete search history.

(56) References Cited

U.S. PATENT DOCUMENTS 11,894,181 B2 2/2024 Raith et al.
2004/0057491 A1* 3/2004 Stenestam ........... G01R 31/333 374/134

(Continued)

FOREIGN PATENT DOCUMENTS

CN 105785880 A 7/2016
DE 102007026175 B4 10/2009

(Continued)

*Primary Examiner* — Eman A Alkafawi
*Assistant Examiner* — Suresh K Rajaputra
(74) *Attorney, Agent, or Firm* — Laurence A. Greenberg; Werner H. Stemer; Ralph E. Locher

(57) ABSTRACT

A method determines an operating state of a transformer located in a high-voltage network. The method includes obtaining measurement values from sensors located in or on a power transformer. The measurement values are used to obtain a liquid temperature measurement of the insulating liquid. The measurement values are supplied to a thermohydraulic simulation model. The thermohydraulic simulation model then determines the operating state of the transformer by providing simulated state parameters which represent the operating state of the transformer. A parameter is an insulating liquid temperature state parameter which corresponds to a temperature value simulated for the insulating liquid. It is desirable to take weather influences such as wind or rain into account. A controlled system is connected upstream of the thermohydraulic simulation model and determines a control deviation formed from the difference between the liquid temperature measurement value and the corresponding simulated insulating liquid temperature state parameter.

8 Claims, 2 Drawing Sheets

(56) References Cited

U.S. PATENT DOCUMENTS

| | | | | |
|---|---|---|---|---|
| 2020/0312538 | A1* | 10/2020 | Raith | G01R 31/62 |
| 2021/0318391 | A1* | 10/2021 | Cheim | G06F 30/3308 |
| 2022/0181908 | A1 | 6/2022 | Natter et al. | |
| 2023/0273270 | A1* | 8/2023 | Boschert | G01R 31/62<br>340/646 |

FOREIGN PATENT DOCUMENTS

| | | | |
|---|---|---|---|
| DE | 102019218803 | A1 | 6/2021 |
| EP | 3435049 | A1 | 1/2019 |
| EP | 3715878 | A1 | 9/2020 |
| EP | 3716437 | A1 | 9/2020 |
| WO | WO 2021110523 | A1 | 6/2021 |
| WO | WO 2021204970 | A1 | 10/2021 |

* cited by examiner

Controlled System
Actuator
Actuator
Controller
Controller
$\Delta\Theta_{ao}$
$D_o$
$y_\alpha$
$y_\varphi$
$U_{AO}$
$u_o$
$e_{AO}$
$e_o$
$\Delta\Theta_{ao, meas}$
$D_{o, meas}$
1
2
3
4
5
5
6
6
7
7

METHOD FOR SIMULATING A TRANSFORMER

FIELD AND BACKGROUND OF THE INVENTION

The invention relates to a method for determining the operating state of a power transformer which is arranged in a high-voltage grid, said power transformer comprising a tank which is filled with insulating liquid, an active part which is arranged in the tank and has windings which enclose a core and sections of the core, and a cooling unit for cooling the insulating liquid, wherein, in the method, measurement values are obtained from sensors which are arranged in or on the respective power transformer, wherein said measurement values are used to obtain a liquid temperature measurement value which corresponds to a measurement temperature of the insulating liquid or is calculated from a plurality of temperature values, wherein at least one temperature value corresponds to a measurement temperature of the insulating liquid, the measurement values and/or values derived therefrom are supplied to a thermohydraulic simulation model as input values, the thermohydraulic simulation model ascertains the operating state of the power transformer by virtue of the thermohydraulic simulation model providing, on the output side, state parameters which together represent the operating state of the power transformer, wherein at least one state parameter is an ascertained insulating fluid temperature state parameter which corresponds to a temperature value which is calculated for the insulating fluid.

A method of this type is known in practice to a person skilled in the art. A “digital image” of the transformer state is thus usually simulated, wherein the physical relationships between temperature, moisture and the aging of the various components of the transformer such as the insulating liquid, insulating solid bodies, metallic conductors and the like are simulated by means of thermohydraulic network models. Such a simulation can be used, for example, to calculate the aging of the insulation of a transformer before it needs to be replaced in the electric energy supply grid.

DE 10 2007 026 175 B4 has disclosed a method for ascertaining the rate of aging of a transformer. According to the previously known method, the rate of aging of a transformer as a high-voltage apparatus is calculated according to the IEC standard 60076-7, wherein the proportion of oxygen and moisture in the insulating liquid of the transformer is taken into account.

EP 3 715 878 A1 discloses a method for determining the overload capacity of a transformer. In the previously known method, input parameters, which are derived from continuously measured measurement values, are provided to a thermohydraulic simulation model.

It is known from the ICE 60076-7 standard for a rate of aging of an electrical transformer to be calculated depending on what is known as the hotspot temperature. Particularly the insulating paper of the windings is taken into account in the calculation. It is assumed by way of approximation that the insulating properties of the insulating paper are dependent on the degree of polymerization of the insulating paper, along with other influencing variables. However, the loads occurring during the operation of the transformer change the degree of polymerization of the insulating paper such that the insulation capability of the winding paper decreases as the lifetime increases and finally becomes insufficient, so that the transformer reaches the end of its lifetime.

The hotspot temperature can be ascertained from measurements of the temperature of the insulating fluid and from the measurement of the winding current. As already explained further above, the lifetime of the transformer can be ascertained from the hotspot temperature.

In the methods known up to now, weather influences in the form of an ambient temperature are provided to the simulation model as input parameters. However, this is in no way sufficient since weather conditions such as wind and rain significantly influence the temperature response of transformers during operation of the installation, resulting in a change in the state of moisture and state of aging of the components of the transformer. Taking wind and rain into account in the simulation model directly has not been possible until now due to the complex relationships between the influence of the weather and the thermal response of the transformer. It would be easy to take into account too many influencing variables, such as installation site, change in the wind direction, wind speed, amount of rain and the like, for example. Furthermore, it must still be ensured that the thermohydraulic relationships in the transformer model, which are embedded there in the form of differential equations, are retained. Therefore, the use of direct temperature measurement values of the insulating fluid in thermohydraulic transformer aging models is not expedient either.

SUMMARY OF THE INVENTION

The object of the invention is to provide a method of the type mentioned at the beginning which makes it possible to take weather influences into account in the simulation while maintaining the physical relationships in a thermohydraulic transformer model.

This object is achieved by virtue of the fact that at least one controlled system is connected upstream of the input side of the thermohydraulic simulation model, which controlled system ascertains a control deviation which is formed from the difference between the liquid temperature measurement value and the insulating fluid temperature state parameter.

The method provided according to the invention makes it possible to take into account temperature changes in the transformer which arise on account of weather influences such as wind or rain without additional measurements being necessary. Within the context of the invention, an additional weather sensor system can be omitted completely.

Weather influences such as wind and rain have an effect on different physical parameters of the cooling installation. For example, the heat transfer coefficient of the cooling installation, the oil throughflow (hydraulic resistances) or the like are changed by weather influences. The change in these physical parameters by the weather influence can be ascertained in the context of the invention by comparing various measurement and simulation temperatures. The control deviation can then be formed using an appropriate controller. In this way, the temperature deviations between the model and reality are minimized. Within the context of the invention, all physical relationships in the model are retained.

Within the context of the invention, recourse can also be made to a simulation model that has already been introduced while maintaining the physical relationships. Introduced and optimized hydraulic relationships between the temperature state, moisture state and state of aging can also be used. In other words, the invention intervenes in the equation system of the model with the corresponding physical parameters and thus makes it possible to mix measurement values and computation values in the physical model.

The control deviation is expediently ascertained in each controlled system by a difference former. Difference formers are widely used in control technology and are available on the market at low cost.

Each control deviation is advantageously supplied to a controller, the control variables of which, provided on the output side, are supplied to the thermohydraulic simulation model.

According to a development which is expedient in this respect, the control variables are supplied to the thermohydraulic simulation program by means of an actuator to which the control variables are transmitted on the input side, wherein the actuator takes the control variables as a basis for ascertaining a manipulated variable parameter which is supplied to the input side of the thermohydraulic simulation model.

According to a development which is expedient in this respect, the state parameters include a parameter which has been ascertained on the basis of a current flowing through one of the windings of the respective transformer (9).

In a particularly preferred variant of the invention, two controlled systems are connected upstream of the input side of the thermohydraulic simulation model. Compared to a variant of the invention with just one controlled system, the use of two controlled systems increases the accuracy with which weather influences can be taken into account. It goes without saying that more than two controlled systems can also be used within the context of the invention.

At least one liquid temperature measurement value $\Delta\Theta_{ao,meas}$ is expediently formed from the difference between an average insulating liquid temperature value $\Theta_{ave}$ and an ambient 11 temperature measurement value $T_{amb}$ according to $\Delta\Theta_{ao,meas}=\Theta_{ave}-T_{amb}$, wherein the average insulating liquid temperature value $\Theta_{ave}$ is ascertained from a temperature measurement value $\Theta_{top}$ measured in the top region of the tank and a temperature measurement value $\Theta_{bot}$ measured in the bottom region of the tank according to $\Theta_{ave}=(\Theta_{top}+\Theta_{bot})/2$.

In another variant of the invention, a liquid temperature measurement value is derived from the difference $D_{o,meas}$ between a temperature measurement value $\Theta_{top}$ measured in the top region of the tank and a temperature measurement value $\Theta_{bot}$ measured in the bottom region of the tank according to $$D_{o,meas} = \Theta_{top} - \Theta_{bot}.$$

Further expedient embodiments and advantages of the invention are the subject matter of the following description of exemplary embodiments of the invention with reference to the figures of the drawing, with the same reference signs referring to functionally identical components.

DETAILED DESCRIPTION OF THE INVENTION

Transformers are key components of electrical supply grids. The failure of a transformer can result in extreme losses and even grid outages. Transformers are therefore carefully monitored. In order to establish the aging of a transformer, a "temperature curve", for example, of the transformer is recorded in order to thus obtain information relating to the present load and lifetime. The aging of a transformer can be calculated, among other things, by way of what is known as a digital twin or, in other words, by way of a thermohydraulic simulation model.

It is known from the ICE 60076-7 standard for a rate of aging of an electrical transformer to be calculated depending on what is known as the hotspot temperature. Particularly the insulating paper of the windings is taken into account in the calculation. It is assumed by way of approximation that the insulating properties of the insulating paper are dependent on the degree of polymerization of the insulating paper, along with other influencing variables. However, the loads occurring during the operation of the transformer change the degree of polymerization of the insulating paper such that the insulation capability of the winding paper decreases as the lifetime increases and finally becomes insufficient, so that the transformer reaches the end of its lifetime.

The hotspot temperature can be determined from measurements of the temperature of the insulating fluid and from the measurement of the winding current. As already explained further above, the lifetime of the transformer can be determined from the hotspot temperature.

The invention is also based on the idea that the temperature of the insulating liquid and the winding current are in any case continuously observed. With regard to digitization, it is additionally probable that these measurement variables or data derived therefrom are transmitted from the respective transformer to a data processing cloud, wherein the data processing cloud continuously determines the lifetime of said transformer from the data made available to it and can make this variable available, for example to a thermohydraulic simulation model.

Figure 1:
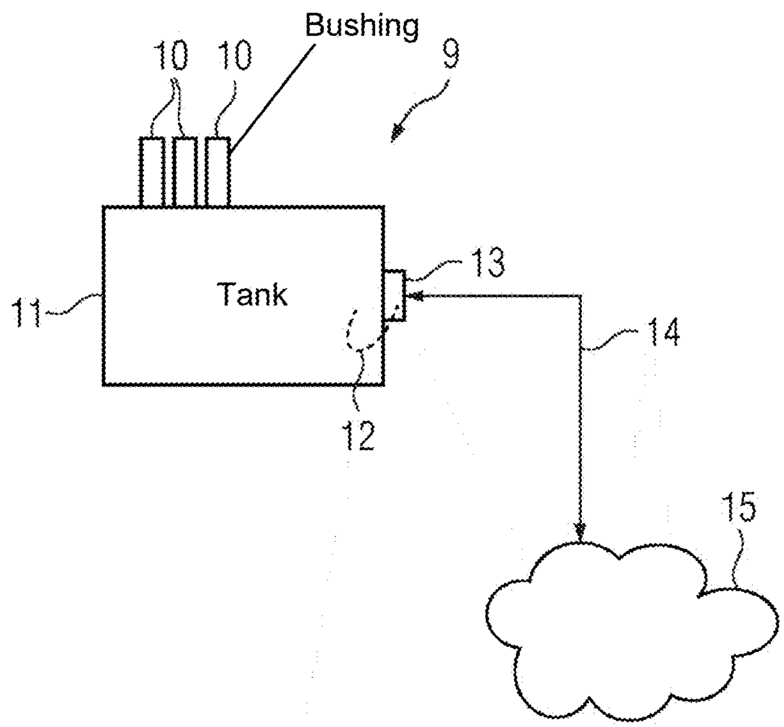
FIG. 1 schematically illustrates a transformer which is simulated by the method according to the invention, and FIG. 2 schematically illustrates an exemplary embodiment of the method according to the invention.

FIG. 1 shows a schematically illustrated transformer 9 with its three bushings 10 which are supported on a tank 11 of the transformer 9. On their end facing away from the tank 11, the bushings 10 have what is known as an outdoor connection to connect an air-insulated high-voltage line of an energy supply grid. Each bushing 10 has an inner high-voltage conductor which extends through a hollow insulator. The insulator and the high-voltage conductor pass through the upper wall of the tank 11 of the transformer 9 and extend by way of their free end into the interior of the tank 11 which is filled with insulating liquid. The high-voltage conductor of each bushing 10 can thus be connected to the respective high-voltage winding of the transformer 9. Each high-voltage winding is arranged concentrically with a low-voltage winding through which a leg of a magnetizable core extends. The high-voltage and low-voltage windings are thus inductively coupled to one another.

The tank 11 of the transformer 9 is filled with an insulating liquid which serves to insulate and cool the high-voltage-connected windings and the core during operation. The transformer also has a cooling unit, but this is not shown in the figure.

The transformer 9 is equipped with temperature sensors which are arranged inside the tank 11 to measure the temperature of the insulating liquid and are therefore not shown in the figure. Each temperature sensor is connected via a short-range communication connection 12 to a communication unit 13 attached to the transformer 9, wherein the short-range communication connection 12 is designed in this case as a cable. The communication unit 13 is in turn connected via a long-range communication connection 14 to a data processing cloud 15.

The temperature measurement values measured by the temperature sensors are transmitted via the short-range communication connection 12 to the communication unit 13. Said communication unit transmits the temperature measurement values via the long-range communication connection 14 to the data processing cloud 15. The data processing cloud 15 has a thermohydraulic load prediction model, which can also be referred to as a digital twin. This model calculates, for example, the consumed lifetime on the basis of the measured temperature measurement values and the measured winding currents according to the aforementioned standard. The lifetime consumption of the transformer 9 is ascertained continuously in this way and is available on demand.

Figure 2:
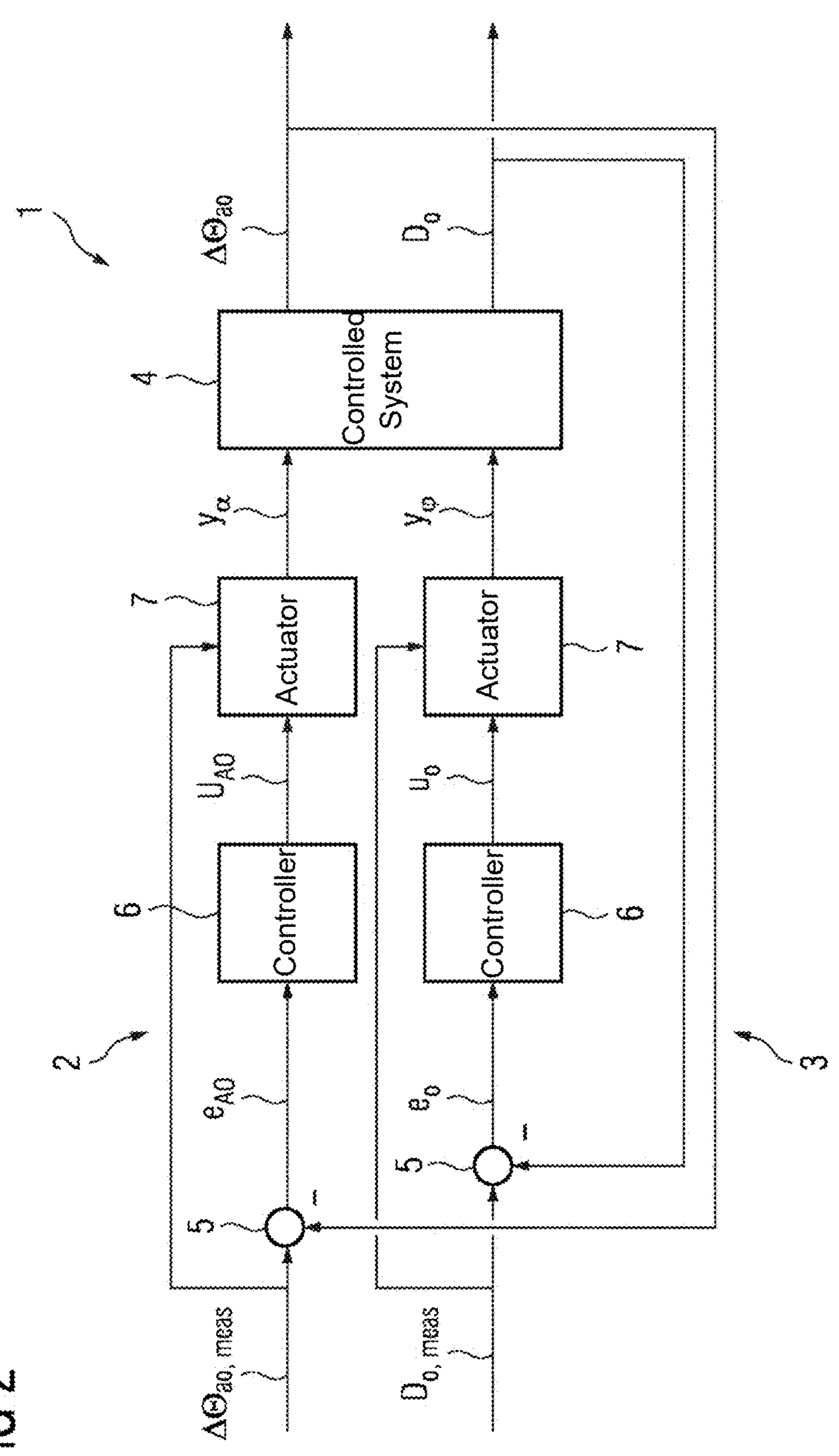

The method 1 according to the invention is schematically illustrated in FIG. 2. Two controlled systems 2 and 3 which are connected upstream of the input side of a thermohydraulic simulation model can be seen. It can be seen that each controlled system has a difference former 5, a controller 6 and an actuator 7. The transformer shown in FIG. 1 has sensors which measure a temperature of the insulating liquid in each of a top and a bottom region of the tank 11, these sensors not being illustrated in the figure. The temperature sensors can alternatively measure the temperature of the insulating liquid in a top intake line of a cooling unit and in a bottom outflow line of said cooling unit. The cooling unit is connected to the tank 11 of the transformer via the top intake line and the bottom outflow line. Hot insulating liquid which results during operation of the transformer rises to the top of the tank 11 and reaches the cooling unit via the intake line, where the insulating fluid is cooled again. The cooled and thus denser insulating liquid then arrives back in the tank via the outflow line.

The output signals provided by the sensor arranged in the top region of the tank 11 are scanned so as to obtain scanned values and these are then digitized by an A/D converter, which is not shown. The same applies to the sensor arranged in the bottom region of the tank 11. The digital temperature measurement values from the top sensor are denoted in the following text by $\Theta_{top}$ and those from the sensor arranged in the bottom region of the tank are denoted by $\Theta_{bot}$. $T_{amb}$ denotes temperature values corresponding to the temperature of the cooling atmosphere.

These measurement values are used to calculate a liquid temperature measurement value $\Delta\Theta_{ao,meas}$ according to $$\Delta\Theta_{ao,meas} = \Theta_{ave} - T_{amb}$$

for the top controlled system 3, wherein in this case $\Theta_{ave}$ denotes the average insulating liquid temperature value which results from the direct measurement values introduced above according to $\Theta_{ave}=(\Theta_{top}+\Theta_{bot})/2$. The liquid temperature measurement value of the bottom controlled system 4 is $D_{o,meas}$, a temperature value of the insulating liquid which can be calculated as follows from the measurement values:

$$D_{o,meas} = \Theta_{top} - \Theta_{bot}.$$

The liquid temperature measurement values $\Delta\Theta_{ao,meas}$ and $D_{o,meas}$ are each supplied to a difference former which forms the difference between the liquid temperature measurement value resulting from measurements and the insulating liquid temperature state parameter $\Delta\Theta_{ao}$ and $D_o$, respectively, which is simulated by the thermohydraulic simulation model so as to obtain the control deviations $e_{AO}$ and $e_O$. Said control deviations are each supplied to the input side of a controller 6, the output side of which provides a control variable for the average insulating liquid heating $U_{AO}$ and a control variable for the liquid temperature expansion $U_o$. These control variables are each supplied to an actuator which takes the control variables and the corresponding measurement values as a basis for generating the value of a manipulated variable $y_a$ and $y_\varphi$, respectively, for the respective controlled system 3 and 4. The manipulated variables $y_a$ and $y_\varphi$, respectively, are finally supplied to the input side of the thermohydraulic simulation model 4 which then simulates the insulating liquid temperature state parameters $\Delta\Theta_{ao}$ and $D_o$, respectively.

The controlled systems 3, 4 counteract an increasing deviation between the simulated insulating liquid temperature state parameters and the equivalent thereof in the real world, that is to say the liquid temperature measurement values $\Delta\Theta_{ao,meas}$ and $D_{o,meas}$.

The invention claimed is:

1. A method for determining an operating state of a transformer disposed in a high-voltage grid, the transformer containing a tank filled with an insulating liquid, an active part disposed in the tank and having windings enclosing a core and sections of the core, and a cooling unit for cooling the insulating liquid, which comprises the steps of:

obtaining measurement values from sensors disposed in or on the transformer, wherein the measurement values are used to obtain at least one liquid temperature measurement value which corresponds to a measurement temperature of the insulating liquid or is calculated from a plurality of temperature values, wherein at least one of the temperature values corresponds to the measurement temperature of the insulating liquid;

supplying the measurement values and/or values derived therefrom to a thermohydraulic simulation model as input values;

ascertaining, via the thermohydraulic simulation model, the operating state of the transformer by virtue of the thermohydraulic simulation model providing, on an output side, simulated state parameters which together represent the operating state of the transformer, wherein at least one of the simulated state parameters is an insulating liquid temperature state parameter which corresponds to a temperature value which is simulated for the insulating liquid; and ascertaining, via at least one controlled system connected upstream of an input side of the thermohydraulic simulation model, a control deviation which is formed from a difference between liquid temperature measurement values and corresponding simulated insulating fluid temperature state parameter.

2. The method according to claim 1, which further comprises ascertaining the control deviation in each said at least one controlled system by a difference former.

3. The method according to claim 1, which further comprises:

supplying each said control deviation to a controller; and supplying control variables of the control deviation, provided on the output side, to the thermohydraulic simulation model.

4. The method according to claim 3, which further comprises supplying the control variables to the thermohydraulic simulation program by means of an actuator which receives the control variables on an input side, wherein the actuator takes the control variables as a basis for ascertaining a manipulated variable which is supplied to the input side of the thermohydraulic simulation model.

5. The method according to claim 1, wherein the simulated state parameters include a parameter which has been ascertained on a basis of a current flowing through one of the windings of the transformer.

6. The method according to claim 1, wherein two controlled systems are connected upstream of the input side of the thermohydraulic simulation model.

7. The method according to claim 1, which further comprises forming the at least one liquid temperature measurement value $\Delta\Theta_{ao}$ from a difference between an average insulating liquid temperature value $\Theta_{ave}$ and an ambient temperature measurement value $T_{amb}$ according to $\Delta\Theta_{ao,meas}=\Theta_{ave}-T_{amb}$, wherein the average insulating liquid temperature value $\Theta_{ave}$ is ascertained from a temperature measurement value $\Theta_{top}$ measured in a top region of the tank and a temperature measurement value $\Theta_{bot}$ measured in a bottom region of the tank according to $\Theta_{ave}=(\Theta_{top}+\Theta_{bot})/2$.

8. The method according to claim 1, which further comprises deriving the at least one liquid temperature measurement value from a difference $D_{o,meas}$ between a temperature measurement value $\Theta_{top}$ measured in a top region of the tank and a temperature measurement value $\Theta_{bot}$ measured in a bottom region of the tank according to $D_{o,meas}=\Theta_{top}-\Theta_{bot}$.

* * * * *